US011085122B2

(12) United States Patent
Gorokhovsky et al.

(10) Patent No.: US 11,085,122 B2
(45) Date of Patent: Aug. 10, 2021

(54) DIAMOND COATED ELECTRODES FOR ELECTROCHEMICAL PROCESSING AND APPLICATIONS THEREOF

(71) Applicant: Vapor Technologies, Inc., Longmont, CO (US)

(72) Inventors: Vladimir Gorokhovsky, Lafayette (CO); Patrick A. Sullivan, Longmont, CO (US); Klaus Brondum, Ann Arbor, MI (US); Patrick Byron Jonte, Zionsville, IN (US)

(73) Assignee: VAPOR TECHNOLOGIES, INC., Longmont, CO (US)

( * ) Notice: Subject to any disclaimer, the term of this patent is extended or adjusted under 35 U.S.C. 154(b) by 613 days.

(21) Appl. No.: 14/736,934

(22) Filed: Jun. 11, 2015

(65) Prior Publication Data
US 2015/0376804 A1 Dec. 31, 2015

Related U.S. Application Data

(60) Provisional application No. 62/017,555, filed on Jun. 26, 2014.

(51) Int. Cl.
*C25B 11/091* (2021.01)
*C25B 11/083* (2021.01)
(Continued)

(52) U.S. Cl.
CPC .......... *C25B 11/091* (2021.01); *C23C 14/024* (2013.01); *C23C 14/042* (2013.01); *C23C 14/0611* (2013.01); *C23C 14/165* (2013.01); *C23C 14/325* (2013.01); *C23C 14/35* (2013.01); *C23C 16/271* (2013.01); *C23C 16/44* (2013.01);
(Continued)

(58) Field of Classification Search
CPC ...... C25B 1/00; C25B 1/04–1/12; C25B 1/13; C25B 11/00; C25B 11/0442; C25B 11/0478; C25B 11/12; C02F 2001/46147
See application file for complete search history.

(56) References Cited

U.S. PATENT DOCUMENTS 5,012,062 A 4/1991 Banks
5,242,711 A * 9/1993 DeNatale ................. G02B 1/02
427/249.9
(Continued)

FOREIGN PATENT DOCUMENTS

DE 10025167 A1 * 12/2001 .......... C02F 1/46109
GB 2490912 A * 11/2012 .......... C02F 1/46109
RU 2005107990 A * 9/2006 .......... C02F 1/46109

OTHER PUBLICATIONS

Machine Translation of RU 2005107990 A (Dukhnovskii, 2006).*
(Continued)

*Primary Examiner* — Alexander W Keeling
(74) *Attorney, Agent, or Firm* — Brooks Kushman P.C.

(57) ABSTRACT

An electrode for an ozone generator or chlorine generator includes an electrically conductive substrate, a doped-Si layer disposed over the conductive substrate, and a boron-doped diamond (BDD) layer disposed over the doped-silicon layer. The doped-silicon layer defines a discrete architecture that maintains adhesion throughout a high temperature CVD boron-doped diamond process. Another electrode having a PVD nitrogen-doped diamond (ta-C:N) layer disposed over a conductive substrate is also provided.

16 Claims, 19 Drawing Sheets

(51) Int. Cl.

| | |
|---|---|
| *C02F 1/461* | (2006.01) |
| *C23C 14/06* | (2006.01) |
| *C23C 16/44* | (2006.01) |
| *C23C 14/35* | (2006.01) |
| *C23C 14/32* | (2006.01) |
| *C23C 14/04* | (2006.01) |
| *C23C 14/16* | (2006.01) |
| *C23C 16/27* | (2006.01) |
| *C25B 1/04* | (2021.01) |
| *C25B 1/13* | (2006.01) |
| *C23C 14/02* | (2006.01) |

(52) U.S. Cl.
CPC ............... *C25B 1/04* (2013.01); *C25B 1/13* (2013.01); *C25B 11/083* (2021.01); *C02F 2001/46147* (2013.01); *Y02E 60/36* (2013.01)

(56) References Cited

U.S. PATENT DOCUMENTS

| | | | |
|---|---|---|---|
| 5,462,609 A | 10/1995 | Patrick et al. | |
| 5,508,492 A | 4/1996 | Pajerski et al. | |
| 6,423,193 B1 | 7/2002 | Miller et al. | |
| 8,277,623 B2 | 10/2012 | Kato et al. | |
| 2004/0180543 A1* | 9/2004 | Lee .................. | H01L 21/28518 438/683 |
| 2005/0224363 A1* | 10/2005 | Saha ................ | C25B 11/04 205/465 |
| 2007/0095655 A1 | 5/2007 | Stadelmann et al. | |
| 2010/0038238 A1* | 2/2010 | Reiser ................ | C02F 1/46109 204/290.15 |
| 2010/0089765 A1 | 4/2010 | Arihara et al. | |
| 2010/0320082 A1 | 12/2010 | Kato et al. | |
| 2012/0199884 A1* | 8/2012 | Shintani ............... | G01N 27/414 257/253 |
| 2014/0076715 A1 | 3/2014 | Gorokhovsky et al. | |

OTHER PUBLICATIONS

DE 10025167 A1 Machine Translation (Year: 2019).*
Li et al ("Synthesis of silicon carbide films by combined implantation with sputtering techniques", Applied Surface Science, 253, 2007, pp. 8428-8434) (Year: 2007).*
Han, Sang-Do et al., "Electro-chemical production of ozone using water electrolysis cell of solid polymer electrolyte (SPE)", Indian Journal of Chemical Technology vol. 13, Mar. 2006, pp. 156-161.
Kraft, Alexander et al., "Electrochemical ozone production using diamond anodes and a solid polymer electrolyte," Electrochemistry Communications 8 (2006) 883-886.
Kraft, Alexander, "Doped Diamond: A Compact Review on a New, Versatile Electrode Material," Int. J. Electrochem. Sci., 2 (2007) pp. 355-385.
Vetrone, Fiorenzo et al., "Nanoscale Oxidative Patterning of Metallic Surfaces to Modulate Cell Activity and Fate", Nano Letters vol. 09, No. 2, 2009, pp. 659-665.

* cited by examiner

DIAMOND COATED ELECTRODES FOR ELECTROCHEMICAL PROCESSING AND APPLICATIONS THEREOF

CROSS-REFERENCE TO RELATED APPLICATIONS

This application claims the benefit of U.S. provisional application Ser. No. 62/017,555 filed Jun. 26, 2014, the disclosure of which is hereby incorporated in its entirety by reference herein.

TECHNICAL FIELD

In at least one aspect, the present invention relates to electrodes for water electrolyzers and ozonizers.

BACKGROUND

Ozone is a strong oxidant that is used for water treatment and disinfection. In many applications, ozone replaces chlorine because of unwanted by-product formation connected with the latter. Ozone dissolved in water is used for disinfection of microbes and organic pollutants, wastewater treatment, and the like. The electrochemical production of ozone has advantages over the conventional technologies such as corona discharge. Ozone from electrochemical production is directly dissolved in water; thereby minimizing technical problems associated with handling ozone gas which is toxic at high concentrations.

During water electrolysis, oxygen evolution is the main rival reaction to ozone production. Thermodynamically, oxygen evolution is strongly favored versus ozone production. Therefore, high current efficiencies for electrochemical ozone production are only possible for anode materials with a high overpotential for oxygen evolution. In the recent years, doped diamond electrodes have been developed and investigated for generation of dissolved ozone. Besides other interesting properties, doped diamond is distinguished by an exceptionally high overvoltage for oxygen evolution in aqueous electrolytes which makes even highly efficient OH radical production possible. In addition, diamond and related materials are stable in aqueous electrolytic processes.

FIG. 1 provides a schematic of a typical scheme of the electrolytic cell for ozone production. Ozonizer 10 includes solid polymer electrolyte (SPE) membrane 12, which functions as both electrolyte and separator between anode 14 and cathode 16 contacting the activated electrodes on both sides. Water fed to the anode side of the cell is dissociated at the interface 20 between the anode and membrane 12 as a result of an applied DC current from power supply 22. To ensure that as much ozone as possible is produced, anode 14 typically has an over-potential that is above the decomposition of water and the ozone reaction potential. The electrodes usually have holes, grooves or porosity to provide both a path for water to reach the active inside surface and an escape route for gas produced by the electrolytic reactions; e.g., hydrogen on cathode side, oxygen and ozone on anode side. Moreover, membrane 12 is impermeable for ozone molecules hence limiting recombination between ozone and hydrogen. Typically, electrolytic cells for production of ozone utilize anodes made of boron-doped diamond (BDD). Typical forms for the diamond electrode are either free standing perforated plates or thick coatings over perforated metal substrates. Typically, the BDD is produced by chemical vapor deposition, which is a high temperature process.

Another prior art SPE ozonizer design is described in detail in Sang-Do Han et. al. *"Electro-chemical production of ozone using water electrolysis cell of solid polymer electrolyte (SPE)"*, Indian Journal of Chemical Technology Vol. 13, March 2006, pp. 156-161. In this design, the NAFION® SPE membrane is sandwiched between two porous titanium electrodes having electrocatalytic oxi-ceramic coatings on the sides facing the membrane. The electrode-SPE assembly is pressed together by two current collector flow plates also made of titanium positioned on opposite sides of the assembly. The current collector flow plates have grooves serving as channels for conducting a flow of gas and/or liquid. These grooves ensure sufficient and uniform supply of water during electrolysis and also an escape route for oxygen and ozone gases in the anodic compartment and hydrogen and water molecules in a cathodic compartment. On the anode side, the water flow provides a supply of water for the electrolysis. The water flow on the anode side also serves as a carrier to transport oxygen and ozone as products of the electrochemical reaction taking place at the electrode-SPE interface. The hydrogen ions first diffuse through the NAFION® SPE membrane; then, react at the cathode electrode creating hydrogen gas. On the cathode side of the cell, the hydrogen is removed either by gas transport or water carrier transport along the channels in the cathode current collector. In this SPE-based design, a porous anode electrode can include a doped diamond electrocatalytic layer on the side facing the NAFION® membrane. The boron-doped diamond features both a large overpotential for evolution of oxygen and a sufficient electrical conductivity—both of which are necessary for high efficiency production of ozone by water electrolysis. The active part of the diamond electrode is the area in close vicinity to the boundary where the diamond surface, polymer electrolyte and water meet.

A SPE-based electrolytic cell utilizing boron-doped diamond electro-catalytic layer deposited by CVD process is also described in U.S. Pat. Appl. No. 2010/0320082. A refinement of this design utililizes a boron-doped diamond coating on the surface of a porous anode interfacing the SPE membrane (NAFION®). This approach is described in Alexander Kraft et.al. "Electrochemical ozone production using diamond anodes and a solid polymer electrolyte," Electrochemistry Communications 8 (2006) 883-886. In this work, the anode electrode is porous niobium coated with boron-doped diamond, a few μm thick, on the side facing a NAFION® SPE membrane. Alternatively, amorphous tetrahedral nitrogen-doped films can be deposited by condensation of a highly-ionized carbon ion beam or carbon plasma using either ion beams or filtered cathodic arc deposition or another suitable PVD coating processes as described in U.S. Pat. No. 6,423,193.

One disadvantage of all of the approaches is the precipitation of calcium salt on and near the surface of the cathode during operation in tap water. To minimize such precipitation, the polarity of the potential on the anode and cathode can be switched periodically. However, materials that are resistant to both oxidation during the anodic polarity and hydrogen embrittlement during the cathodic polarity are limited and can be both costly (e.g. standalone diamond) and difficult to process (e.g. silicon). Having different materials for the anode and cathode can be more cost-effective and allow a larger flexibility in design of the cell. Another disadvantage of some of these approaches is insufficient flow of water near the surface in which ozone is formed. Insufficient flow of water promotes degradation of the material at the surface of the anode through prolonged exposure to the generated chemical species and limits efficient transfer of the ozone into solution.

Deposition of polycrystalline diamond coatings by CVD or plasma assisted CVD (PACVD) processes is a well-known technology. Examples of process for forming diamond coating include hot filament CVD (HFCVD); combustion flame CVD CFCVD); arc jet plasma-assisted CVD (AJCVD); laser-assisted CVD (LCVD); and RF or microwave plasma-assisted CVD (RF or MW CVD). Typically, a polycrystalline diamond CVD coating deposition process includes the following steps:

(1) Cleaning in an ultrasonic bath with acetone;
(2) Seeding in submicron diamond slurry in ultrasonic bath to increase the density of diamond nucleation sites;
(3) Cleaning in acetone;
(4) Drying by isopropyl alcohol;
(5) Subjecting to polycrystalline diamond coating deposition process in CVD reactor.

The gas composition coatings in hot filament reactors, DC arc plasma reactors and MW reactors is typically consists of less than 1% CH4 in H2 which can be mixed with argon as a buffer gas. For deposition of boron-doped diamond coating which is necessary for ozone generating electrodes, trimethylborane can be added to reactive gas atmosphere in proportion ranging from 0.1 to 1% of hydrocarbon (HC) gas. The pressure during deposition of diamond CVD coating can range from 1 mtorr to atmospheric pressure and typically ranging from 1 to 100 torr. The substrate temperature during deposition of CVD diamond coatings is typically ranging from 600 to 950 deg C.

CVD diamond coatings can be deposited on many different substrates, but substrates materials which can form carbides in HC contained atmospheres at high temperatures are preferable for achieving better coating properties like a continuous film, no voids or holes and a density near the theoretical value of 3.5 g/cm$^3$. The electrodes in an electrolytic ozone generator can be subjected to periodic switching of the polarity which shifts them from anode to cathode during operation. During exposure as a cathode, the electrodes are subjected to reducing conditions with a high concentration of nascent hydrogen. During exposure as an anode, they are subjected to intense oxidizing conditions. Because of these operating conditions the electrodes must be stable against degradation both as anode and as a cathode in electrochemical process. Moreover, any exposed metal in contact with water as a part of anode in electrochemical process, has a much lower overpotential than that of diamond coating. In this case, oxygen will be generated on the metal surface competing with ozone generated on surface of diamond, which reduces the effectiveness of the ozone generating process. To overcome this drawback, the metal substrate must have the ability to passivate by forming a stable and dense oxide film when exposed as an anode in electrochemical process. Metals such as Nb, Ta, W, Mo and Si are known as favorable substrates for growing polycrystalline diamond coatings by CVD and PACVD processes. Nb and Ta form a stable oxide in an oxidizing (anodic) environment, but are prone to hydrogen embrittlement and subsequent cracking and degradation as cathodes. W and Mo are stable as cathodes, but as anodes they form unstable oxides transforming their surface into powder. Conductive boron- or phosphorus-doped silicon is stable both as anode and as a cathode, but it is brittle and requires expensive micromachining to form electrodes for electrochemical processes. As a result, a need exists for improved electrodes for the electrochemical production of ozone to treat water.

Accordingly, there is a need for improved design for the electrochemical production of ozone to treat water.

SUMMARY

The present invention solves one or more problems of the prior art by providing in at least one embodiment an electrode for an ozone generator or a chlorine generator. The electrode includes an electrically conductive substrate, a doped-Si layer disposed over the electrically conductive substrate, and a boron-doped diamond (BDD) layer disposed over the doped-silicon layer. The doped-silicon layer defines a discrete architecture that maintains adhesion throughout a high temperature CVD boron-doped diamond process.

In another embodiment, an electrode for an ozone generator or a chlorine generator is provided. The electrode includes an electrically conductive substrate and a PVD nitrogen-doped diamond (ta-C:N) layer disposed over the electrically conductive substrate. Typically, the substrate is a doped-Si substrate or doped-Si coating on an electrically conductive substrate.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

In general, the present invention provides coating architecture that includes a doped-Si sublayer that can be continuous, patterned, modulated or discrete. The boron-doped diamond coated electrodes overcome many of the disadvantages of the prior art thin polycrystalline boron-doped diamond films over metallic substrates. In particular, the present embodiment provides an electrically conductive doped-silicon barrier interlayer which effectively protects metal substrates against degradation during exposure at both the anode and the cathode in an electrochemical process. Moreover, the present embodiment advantageously retains a surface composition favorable for growing polycrystalline diamond chemical vapor deposition (CVD) films. A silicon sublayer, barrier coating positioned between the metal substrate and top diamond CVD layer allows the use of virtually any refractory metal as a substrate for boron-doped diamond coated electrodes in electrochemical water treatment. Alternatively, the ferrous metals, even when coated with a thin film of silicon, are still unfavorable as a substrate material due to high inward carbon diffusion rate through thin silicon interlayer into bulk ferrous metal substrate. Examples of the metal substrates which can be used for diamond coated electrodes with silicon barrier sublayer include Ti, W, Mo, Nb, Ta, Cr, Zr, V. Among these metals, Ti is economical and forms a passivating oxide film in anodic mode.

Figure 1:
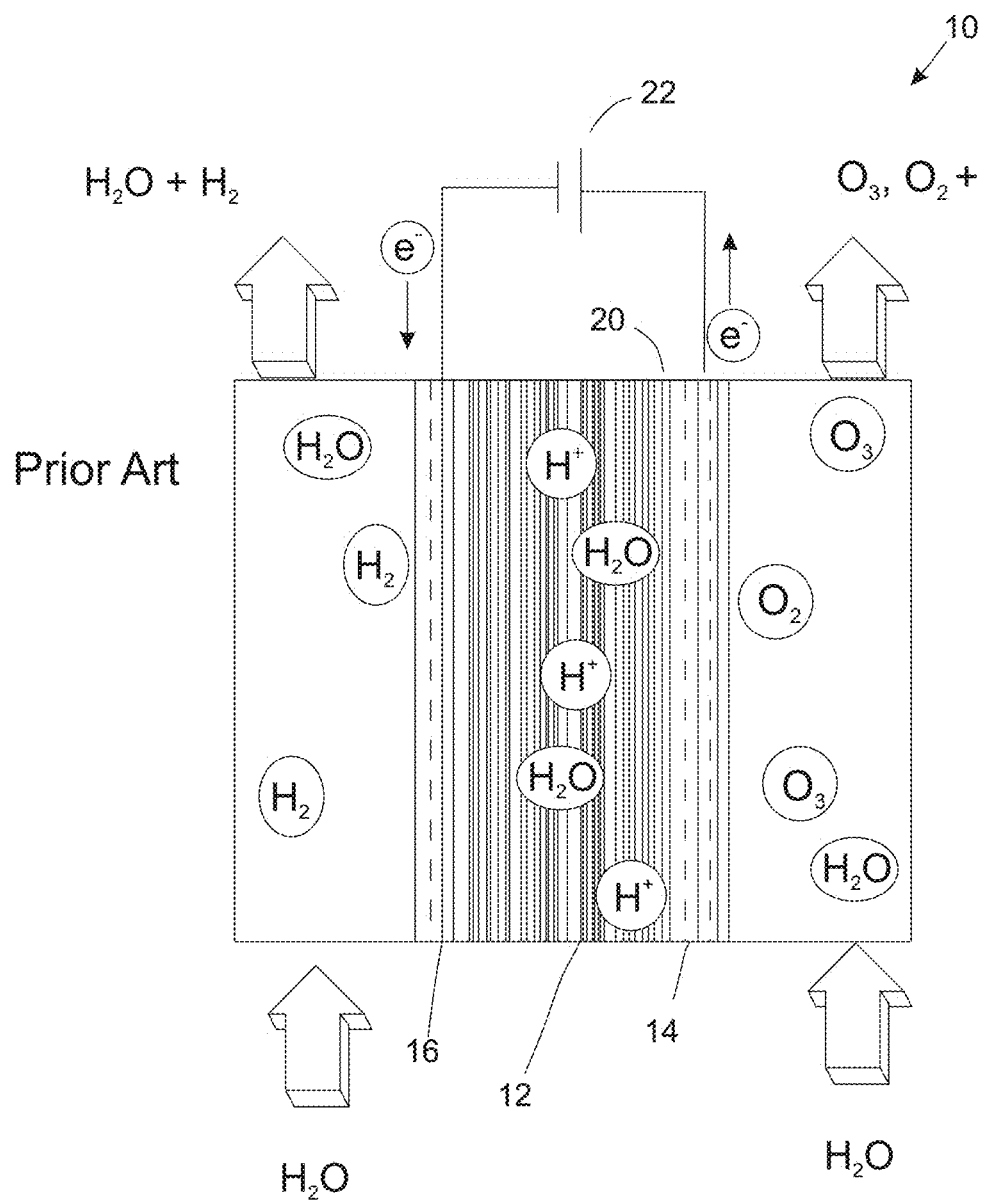
FIG. 1 provides a schematic of a typical scheme of the electrolytic cell for ozone production.
Figure 2A:
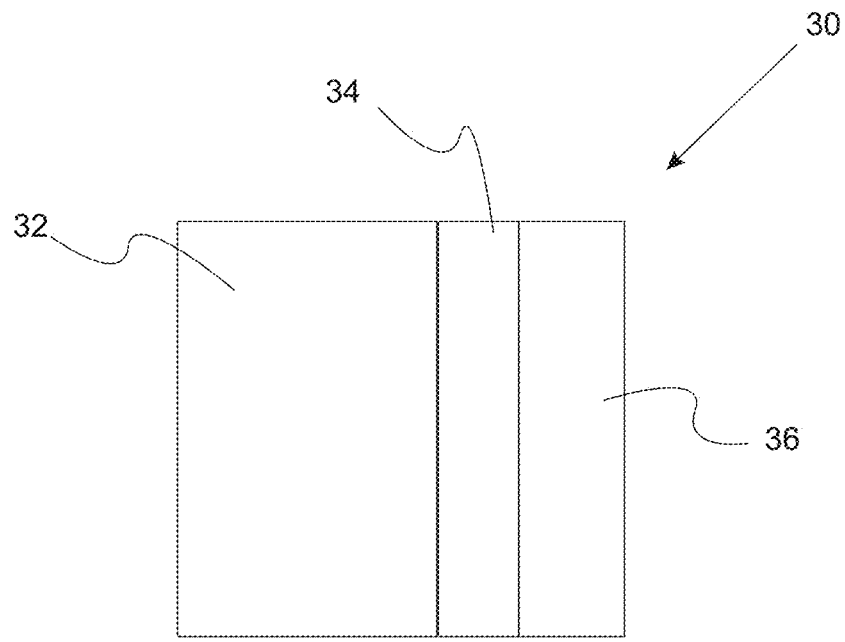
FIG. 2A provides a schematic cross section of an electrode for an ozone generator or chlorine generator.

With reference to FIG. 2A, a schematic cross section of an electrode for an ozone generator or chlorine generator is provided. The electrode 30 includes an electrically conductive substrate 32, a doped-silicon layer 34 disposed over the conductive substrate, and a CVD boron-doped diamond (BDD) layer 36 disposed over the doped-silicon layer 34. Doped-silicon layer 34 is also referred to as silicon interlayer 34. The doped-silicon layer 34 defines a discrete architecture (e.g., a pattern) that maintains adhesion throughout a high temperature CVD boron-doped diamond process. In a refinement, doped-silicon layer 34 has a pattern with features less than 100 nm.

Figure 2B:
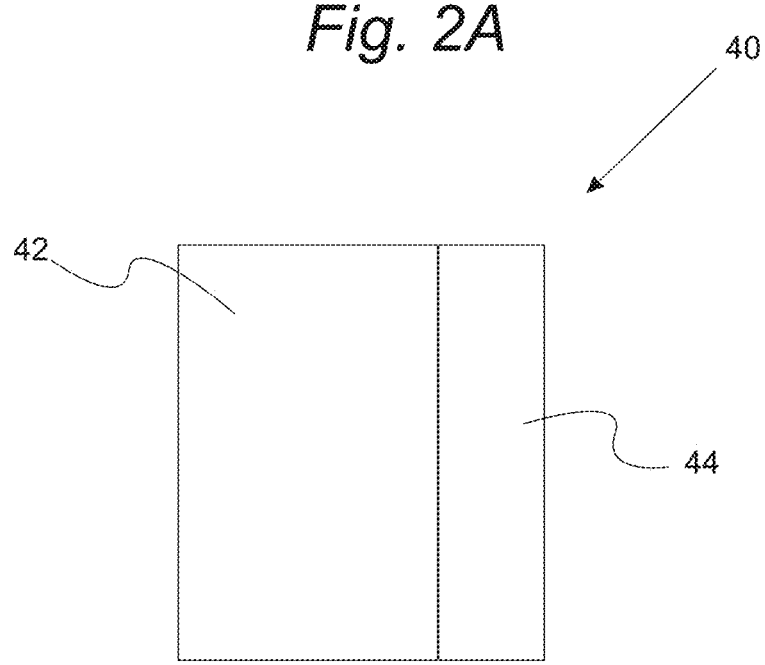
FIG. 2B provides a schematic cross section for another electrode for an ozone generator or chlorine generator.

With reference to FIG. 2B, a schematic cross section for another electrode for an ozone generator or chlorine generator is provided. The electrode 40 includes a conductive substrate 42 and a PVD nitrogen-doped diamond (ta-C:N) layer 44 disposed over the conductive substrate 42. In a refinement, the PVD nitrogen-doped diamond (ta-C:N) layer 44 has a thickness from 10 nm to 5 microns. Typically, the substrate is a doped-silicon substrate or doped-Si coating on a conductive substrate.

Figure 3:
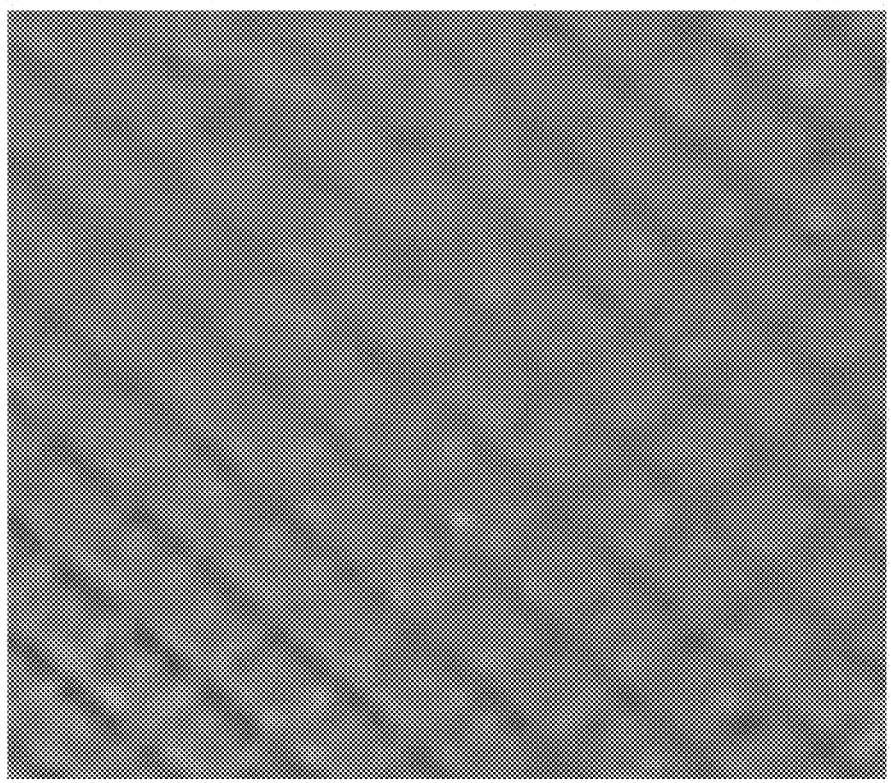
FIG. 3 illustrates a discrete ceramic coating that can be deposited on metal substrate by a cathodic arc deposition process with the substrate masked by a mesh metal screen.

Coating adhesion and stability of boron-doped diamond (BDD) layer 36 (FIG. 2A) or PVD nitrogen-doped diamond (ta-C:N) layer 44 (FIG. 2B) are improved by reduction of coating stresses. In this regard, the morphology of the silicon interlayer coating 34 can possess a discrete morphology that minimizes internal coating stresses and stresses due to the thermal expansion coefficient mismatch between the substrate and silicon sublayer. This modulated surface morphology survives after deposition of the boron-doped diamond CVD top layer. For continuous films that experience significant residual compressive stresses, the bulging and subsequent delamination of the coating can be avoided through the formation of discrete or modulated patterns in the coating. FIG. 3 illustrates a discrete ceramic coating that can be deposited on metal substrate by a cathodic arc deposition process with the substrate masked by a mesh metal screen. The discrete topography can improve both self-organization of the substrate-coating system and coating stability and durability under strain. In addition, the modulated morphology of the diamond-coated electrodes can develop a micron-sized microchannel at the electrode-polymeric electrolyte membrane interface promoting the formation of ozone through increased microfluidic circulation.

Figure 2C:
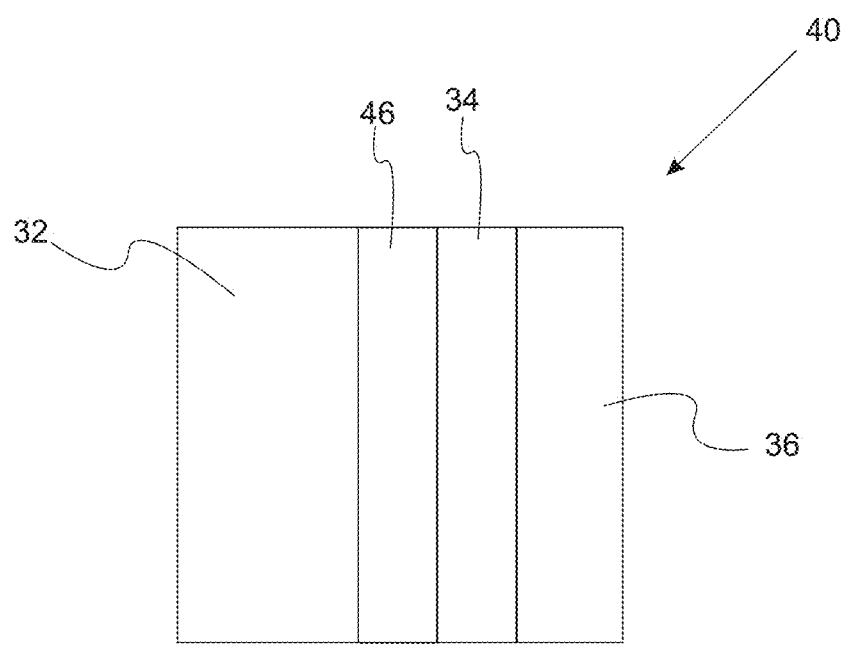
FIG. 2C provides a schematic cross section of another electrode with a nitride barrier layer.

With reference to FIG. 2C, a schematic cross section for another electrode with a nitride barrier layer for an ozone generator or chlorine generator is provided. Electrode 40 includes a nitride barrier layer 46 (e.g. TiN or ZrN) deposited between Si interlayer 34 and metal substrate 32 is provided. The nitride-based barrier interlayer 46 inhibits silicon diffusion into the bulk metal substrate thereby reducing the reactive interaction between the silicon coating and bulk metal substrate. This inhibition of silicon diffusion allows for subsequent diamond nucleation pretreatment of the Si layer under high temperature conditions during exposure of the coated and pre-treated substrate in a polycrystalline diamond CVD reactor. In a refinement, the thickness of the nitride barrier layer is from 0.1 μm to 10 μm. A nitride barrier layer thickness less than 0.1 μm is not sufficient to protect against reaction of the bulk metal substrate with silicon and silicon diffusion into substrate. A nitride barrier thickness greater than 10 μm is impractical and not necessary to provide the necessary barrier properties. In a refinement, prior to exposure to micro-scratch ultrasonic treatment in a diamond powder suspension, the silicon-coated metal substrate with or without a nitride barrier interlayer can be subjected to one or more heat cycles under an inert atmosphere or in vacuum up to maximum temperature ranging from 700 to 1000° C.

Figure 4:
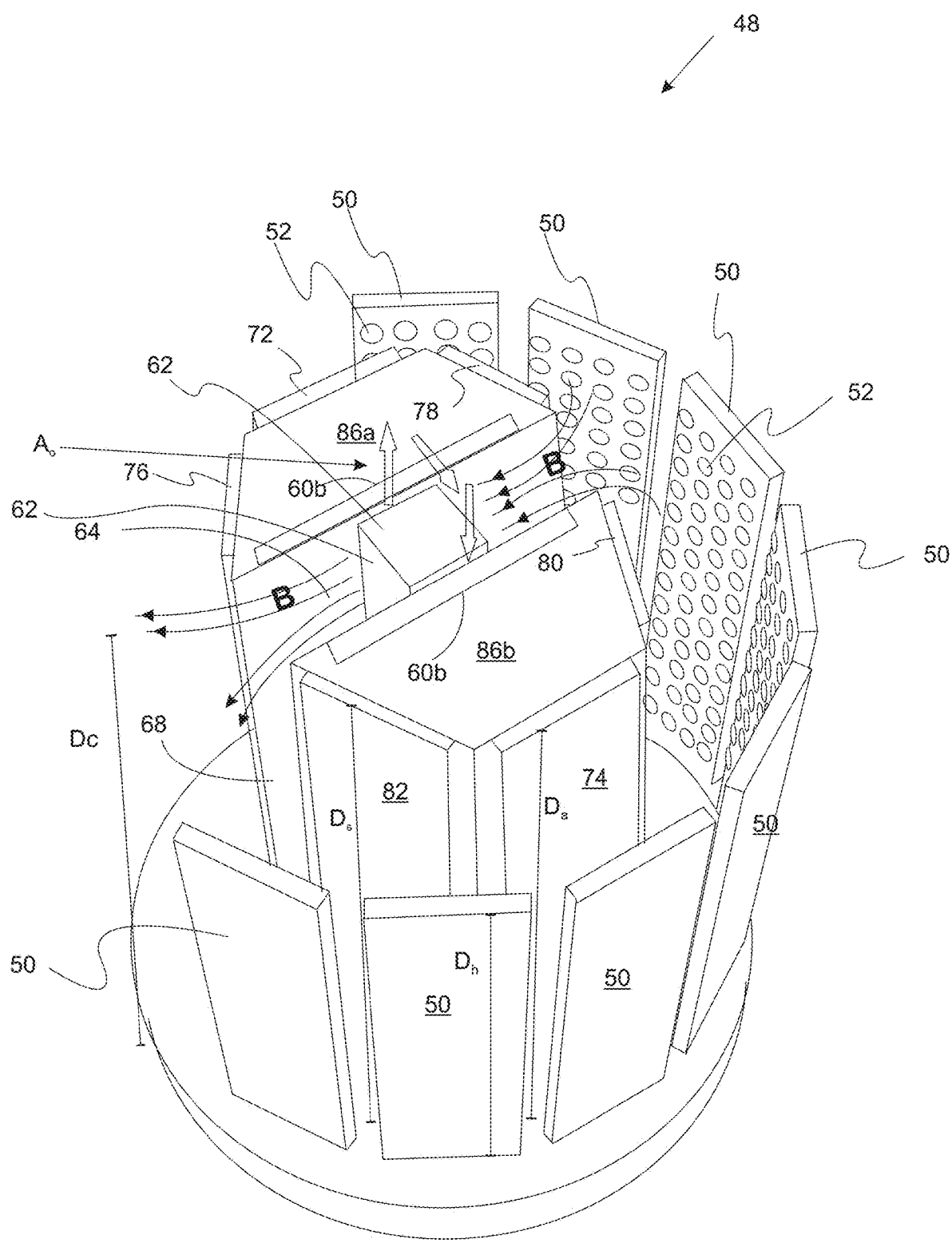
FIG. 4 provides a schematic perspective view of coating system using a remote anode arc discharge (RAAD)

The discrete coating approach set forth above is also beneficial for deposition of nitrogen-doped amorphous diamond coating or tetrahedral amorphous nitrogen doped carbon (ta-C:N) which can be used for electrodes in chlorine generators. Typically, ta-C:N coatings can be deposited on different substrates such as W, Mo, Nb, Ta, Cr, Zr, V, Pt, Au and Si in addition to metal substrates with a Si, Pt or Au barrier coating. For example, ta-C:N coatings can be deposited by physical vapor deposition (PVD) processes such as filtered cathodic arc deposition with magnetically steered cathodic arc spots. In this process, a carbon plasma is generated by vacuum cathodic arc spots on the surface of a graphite cathode target. Unwanted macroparticles and neutrals are filtered, either mechanically or magnetically, by bending the carbon vapor plasma stream in the curvilinear magnetic field while neutrals, which are not affected by electromagnetic field, are trapped by the baffles. A schematic illustration of such a coating deposition process is provided by FIG. 4 which incorporates features from US Pat. Application No. 2014/0076715; the entire disclosure of which is hereby incorporated by reference. Referring to FIG. 4, deposition system 48 uses the magnetic field generated by the duct coil 60 (i.e., 60a and 60b) to steer the cathodic arc spots along the sides of the cathode target bar 62 parallel to the magnetic field force lines as set forth above. The direction of the movement of the cathodic arc spots is shown by the arrows $A_D$. The ends of the plasma duct 64 are opened which allows the cathodic metal vapor plasma to flow along magnetic force lines toward substrates 52 installed on substrate holder 50 in the coating chamber. The neutrals and macroparticles are trapped within the cathode chamber on the inner walls of the duct 68 yielding near 100% ionized metal vapor plasma to enter in the coating area outside of the plasma duct 68. This design of the cathode chamber is essentially that of a filtered cathodic arc metal vapor plasma source capable of getting rid of macroparticles and neutrals in the outcoming metal vapor plasma and yielding nearly 100% atomically clean ionized metal vapor for deposition of advanced coatings. The RAAD plasma established between the cathode 62 and the remote anodes 72, 74 enhances ionization and activation of the plasma environment in the RAAMS coating deposition process, resulting in improved coating properties. In this design, the hybrid coating deposition processes can be conducted as a single cathodic arc or magnetron coating deposition or as a hybrid process combining cathodic arc metal vapor plasma with magnetron metal sputtering flow immersed in a highly ionized remote arc plasma environment.

Still referring to FIG. 4, the issue of arc plasma enhancement of large area magnetron sputtering coating deposition process and hybrid processes is addressed by positioning at least one remote arc anode off line-in-sight with the cathode target bar 62. In this variation, at least one substrate 52 held by substrate holder 50 and magnetron sputtering sources 76-82 are positioned in a coating chamber region outside of the plasma duct 68. The present RAAMS process effectively immerses the metal sputtering flow generated by conventional magnetron sources in the dense and highly ionized remote anode arc discharge (RAAD) gaseous plasma. The remote arc power supply (not shown) which powers the RAAD plasma is installed between the arc cathode target 62 and the at least one remote anode 72. Remote anodes 72 and 74 have a linear remote anode dimension $D_a$. Magnetron sputtering sources 76-82 have linear source dimension $D_s$. Cathode target 62 has a linear cathode target dimension $D_c$. Substrate holder 50 has a linear holder dimension $D_h$. In a refinement, the linear remote anode dimension $D_a$, the linear cathode target dimension $D_c$, and the linear holder dimension $D_h$ are parallel to each other. The remote anodes 72, 74 provide at least 20% higher open circuit voltage than the power supply which powers the primary arc discharge in a cathode chamber which is ignited between the arc cathode 62 and the proximate anode. The proximate anode can be an inner wall of the plasma duct enclosures 86a, 86b or, optionally, an independent anode electrode within plasma duct 68. In another refinement, several additional remote anodes, each of them associated with at least one arc cathode positioned within plasma duct 68, may be utilized. The remote anodes are positioned at strategic positions within the coating chamber between the end-openings of the plasma duct 68 off line-in-sight from cathode 62. This process is capable of depositing by remote arc assisted magnetron sputtering (RAAMS) process a silicon passivation promoting layer and, optionally, the nitride diffusion barrier interlayer between silicon layer and metal substrate prior to deposition of nitrogen-doped diamond-like carbon coating ta-C:N layer by filtered cathodic arc deposition.

Figure 5:
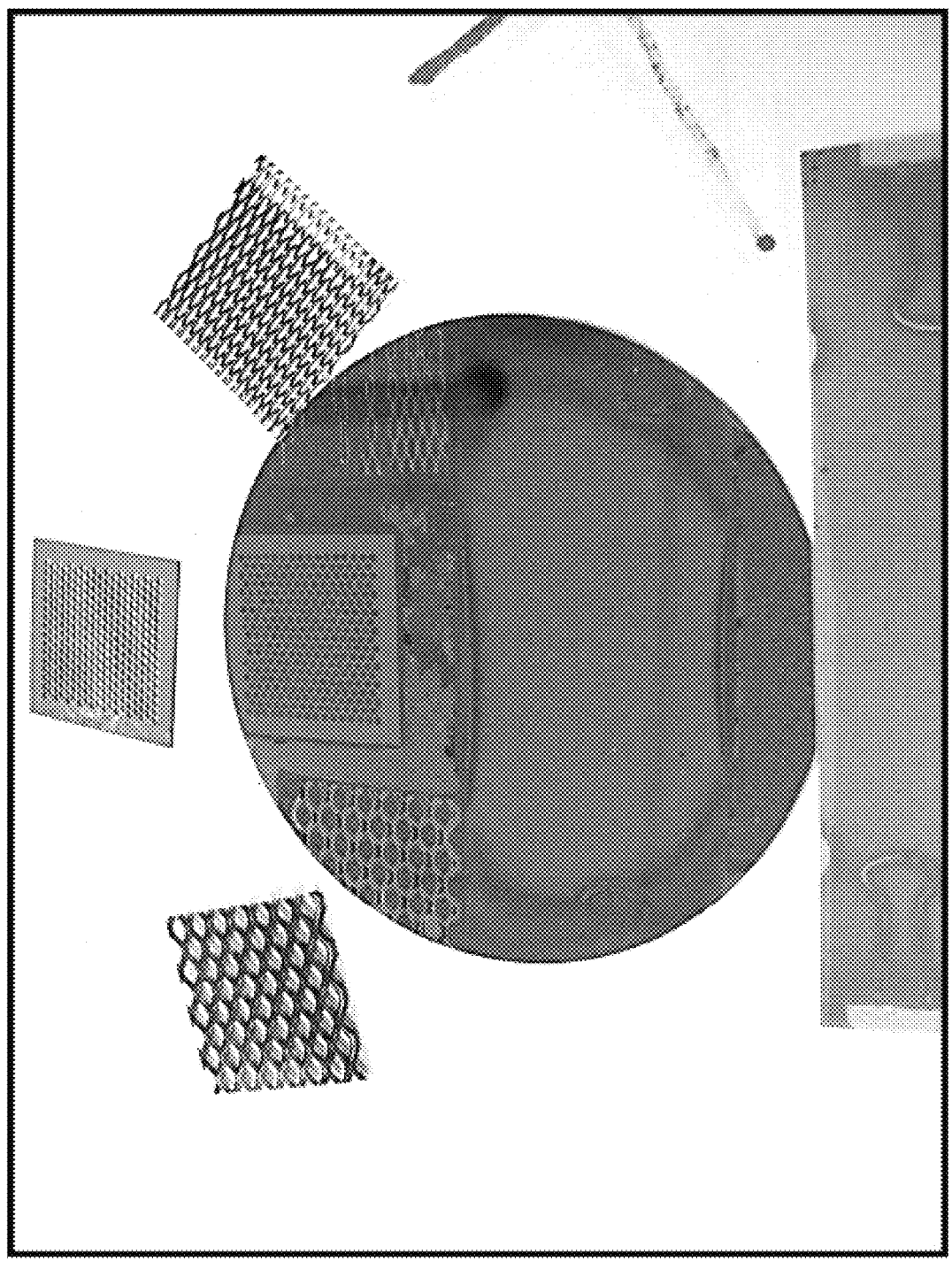
FIG. 5 provides an image of a ta-C:N coating on a Si wafer along with various grids for forming a discrete architecture.

In general, ta-C:N coatings usually have a high level of stress that makes it difficult to deposit thick ta-C:N coatings on different metal substrates. As illustrated by FIG. 5, discrete coatings of different patterns obtained by deposition of metal vapor on masked substrate surfaces can be used to deposit thick ta-C:N coatings which will extend the service life of the electrodes operating in salted water in a chlorine generator. FIG. 5 provides an image of a ta-C:N coating on a Si wafer. During deposition, areas of the wafer can be masked with different grids. Examples of such grids include, but are not limited to, Ti expanded metal grids, perforated sheet of highly oriented pyrolytic graphite, expanded Nb coated with Pt and a stainless steel screen with a fine mesh. FIG. 5 shows different mesh metal masks adjacent to masked coated areas on the surface of a silicon substrate. Advantageously, coatings are modulated in the pattern of the mask. It should be noted that ta-C:N coatings delaminate in unmasked areas while adhere in masked areas. In these unmasked areas, the stress of the coatings overcomes the strength of adhesion of the coating while in the masked areas stress was lower due to the discrete architecture.

Figure 6:
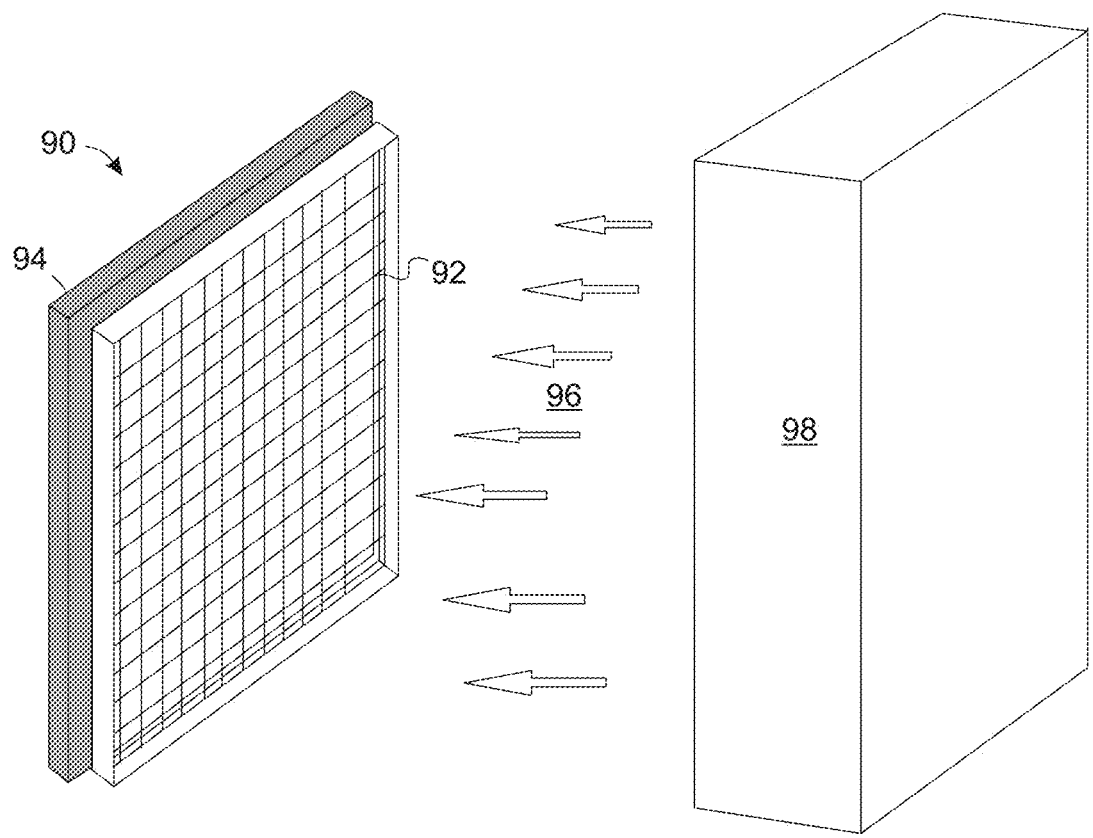
FIG. 6 is an schematic illustration of a deposition system using a mask.
Figure 7:
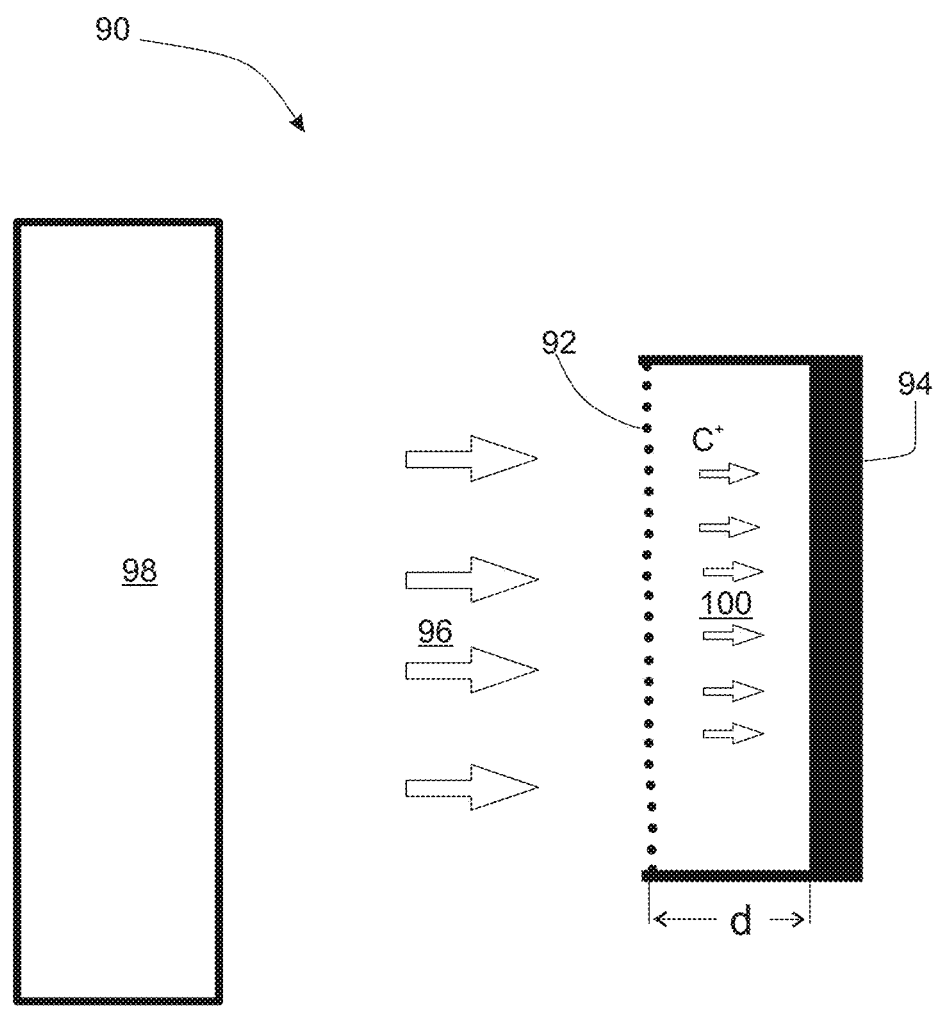
FIG. 7 is an schematic illustration of a deposition system using a mask.

FIGS. 6 and 7 provide illustrations of a deposition system using a metal mask. An advantage of using metal masks is the ability of accelerating carbon ions during coating deposition on substrates made of dielectric materials such as glass, alumina or silica or semiconductive or low conductivity materials such as silicon or germanium. FIG. 7 shows deposition system 90 and mesh metal mask 92 positioned above the surface of the substrate 94 to be coated and spaced from the substrate by the distance d. When the negative bias voltage is applied to the substrate 94, carbon ions are extracted from the incoming carbon plasma flow 96 generated by the filtered cathodic arc source 98 or other type of plasma source capable of generating carbon vapor plasma. An accelerated ion flow 100 is produced within the gap between the mesh metal screen 92 toward the surface of the substrate 94 to be coated by the potential difference $V_i = V_b - V_p$, which is the plasma potential in the area of plasma flow 96 near the metal mesh 92 and $V_b$ is the bias potential applied to the substrate 94 to be coated with attached metal mesh 92. To achieve adequate plasma acceleration by the metal mesh screen, the openings in the mesh typically have a largest spatial dimension from 10 μm to 1 mm. When openings are greater than 1 mm, the screen loses the ability to extract ions from the plasma flow with the plasma leaking throughout the metal mesh screen 92. Openings less than 10 μm are impractical and also unable to produce a discrete pattern of the DLC coating.

Conductive doped Si layers can be deposited on different metal substrates by a number of methods known to those skilled in the art. For example, doped Si layers can be deposited by CVD or plasma assisted CVD (PACVD) processes in a reactive atmosphere containing disilane ($Si_2H_6$) as a source of silicon and phosphine ($PH_3$) and/or diborane ($B_2H_6$) as a source of phosphorus and boron. The conductive doped Si layers can also be deposited by a chemically enhanced physical vapor deposition (CAPVD) method using either e-beam evaporation of silicon or magnetron sputtering of silicon target as a source of silicon with phosphorus and/or boron doping achieved by adding phosphine and/or diborane to the reactive gas atmosphere or by using a silicon target that is already doped. Boron doped silicon has p-type conductivity while phosphorus-doping silicon has n-type conductivity. Such electrical conductivity is necessary for sub-layers in water treatment diamond coated electrodes.

Figure 8:
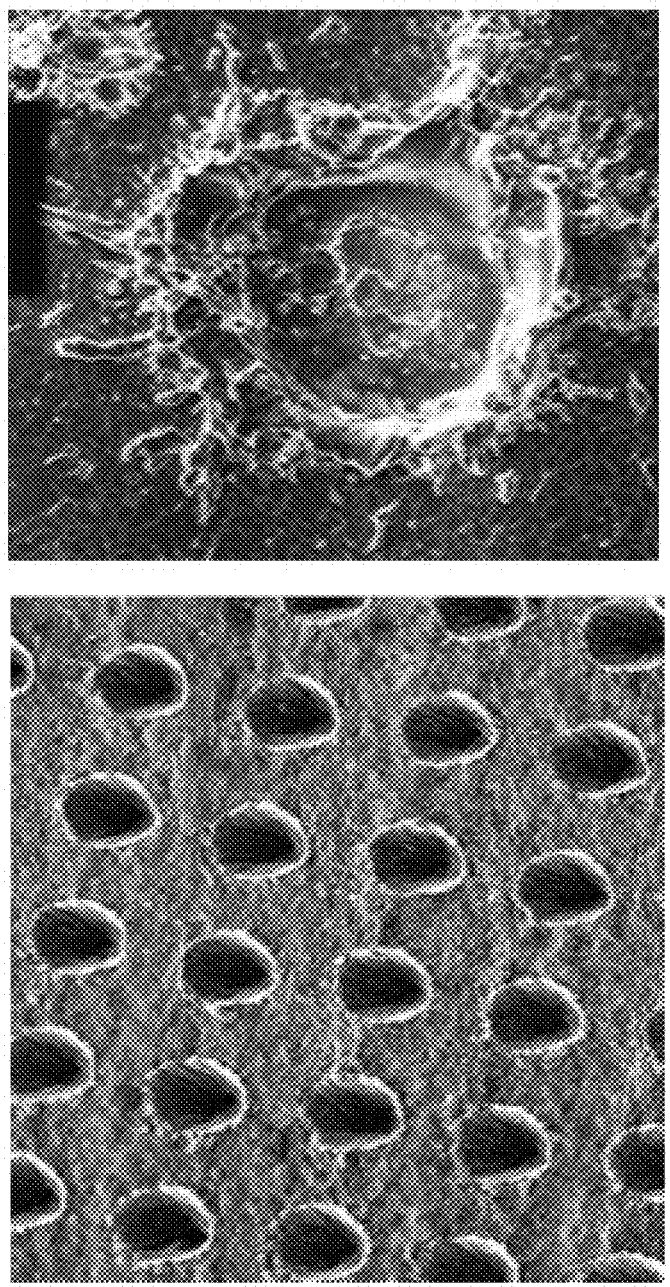
FIG. 8 is a micrograph showing dimples in a silicon layer.
Figure 9:
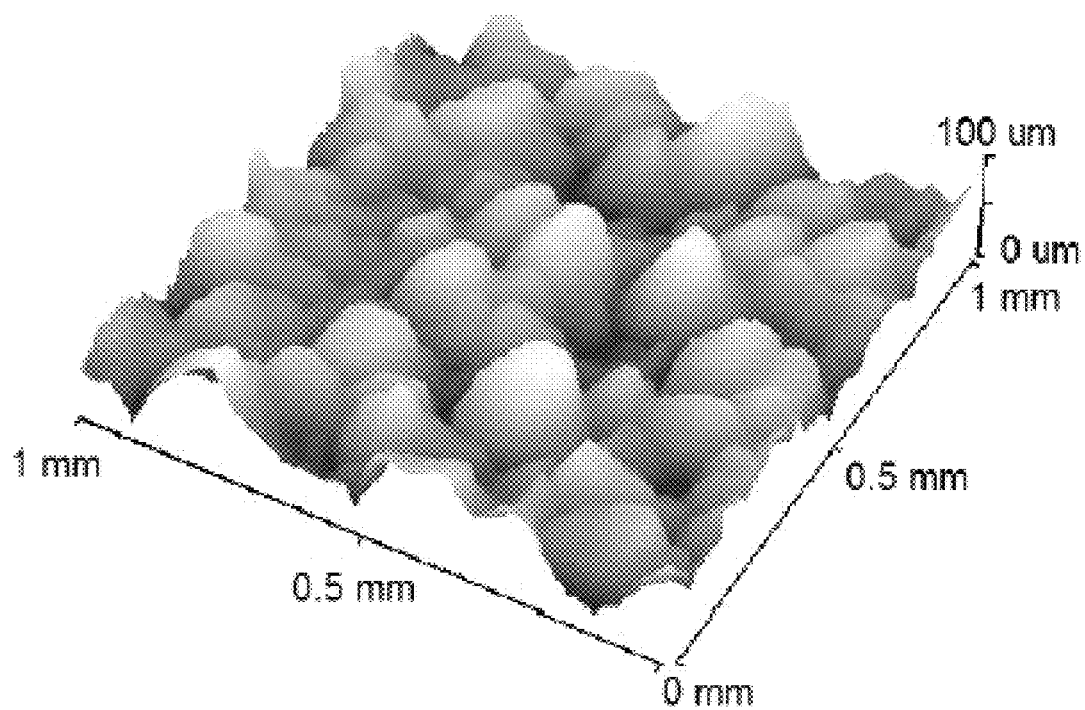
FIG. 9 is an illustration of a randomly roughened surface.
Figure 10:
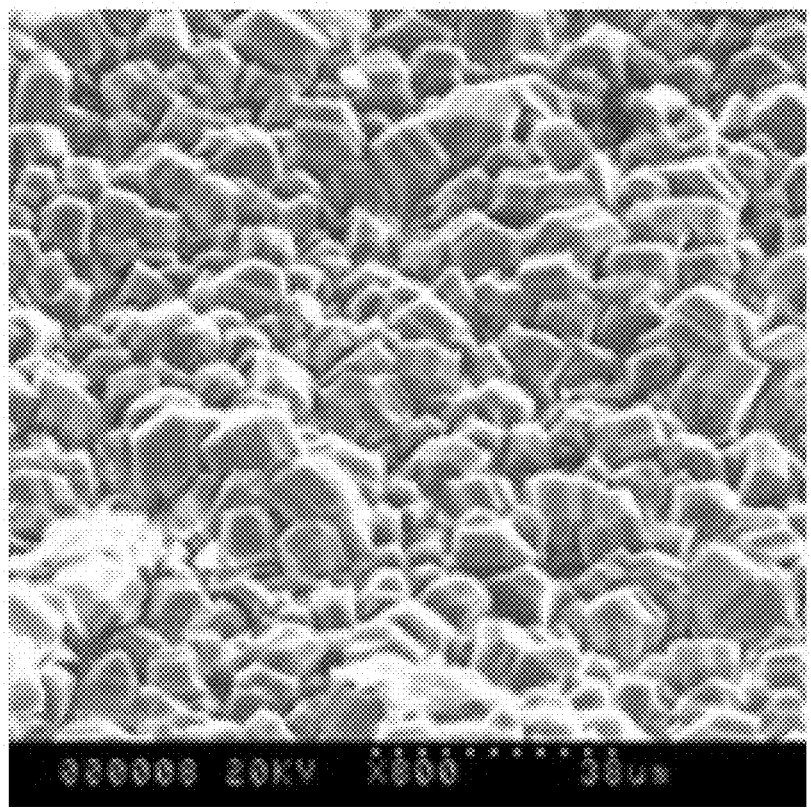
FIG. 10 provides a micrograph of a tungsten substrate that has been randomly roughened and coated with a diamond powder.

A number of techniques can be employed to roughen the substrate surface prior to deposition of the doped silicon interlayer. For example, texturing can be created by wet or dry grit or bead blasting, vibratory tumbling or etching. Moreover, patterns on the surface can be produced by a programmed laser ablation technique, which can provide a precisely controlled surface profile. FIG. 8 provides on the left side a micrograph of an array of dimples with different diameters, depths, and spacing produced by a pre-programmed laser ablation texturing technique. A micrograph of a single laser dimple is shown on the right side of the FIG. 8. The density and dimensions of these micro-holes can be used as variables for optimizing the laser patterning of the substrate surface of electrochemical electrodes. A less expensive technique for achieving surface texturing is by surface graining of the metal substrate with randomly moving vacuum arc spots as set forth in U.S. Pat. Nos. 5,012,062, 5,462,609, and 5,508,492; the entire disclosures of which are hereby incorporated by reference. These techniques produce a randomly roughened surface with large differences between ridges and valleys. An example of a randomly roughened surface is shown in FIG. 9. A desirable pattern including microchannels can also be produced on the surface of metal substrate by micromachining techniques involving photolithography followed by chemical (wet) etching or plasma (dry) etching. Thin polycrystalline diamond CVD coatings deposited on the roughened substrate advantageously retain the pre-deposition surface profile. FIG. 10 provides a micrograph of a tungsten substrate that has been randomly roughened and coated with diamond. In another refinement, a pattern of channels can be directly stamped into a metal surface.

Figure 12:
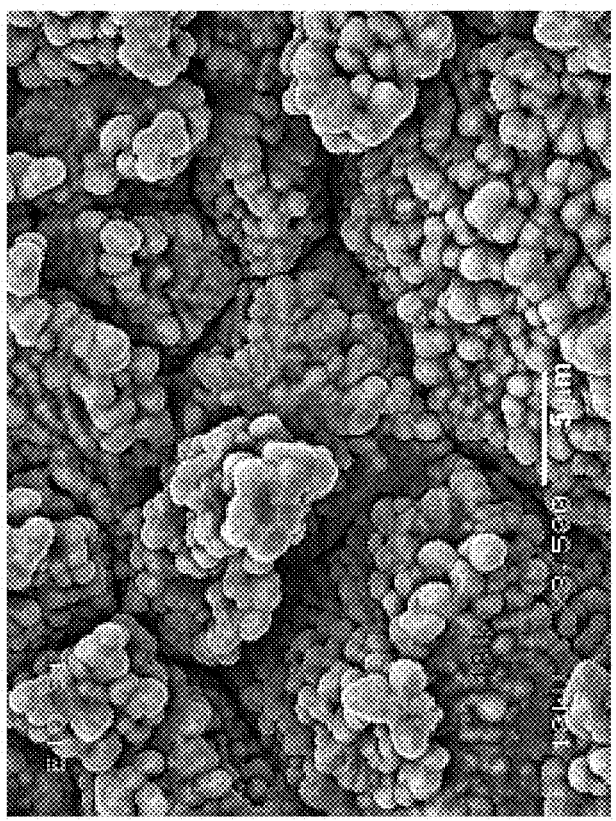
FIG. 12 is a micrograph showing a portion of FIG. 11 coated with doped silicon.
Figure 11:
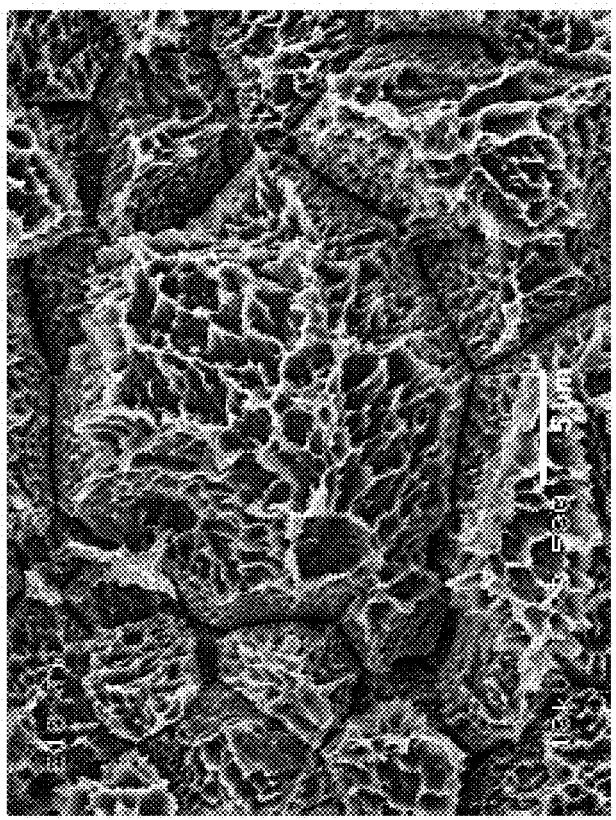
FIG. 11 provides a high resolution scanning electron microscope (SEM) image of a Ti substrate after etching.
Figure 14:
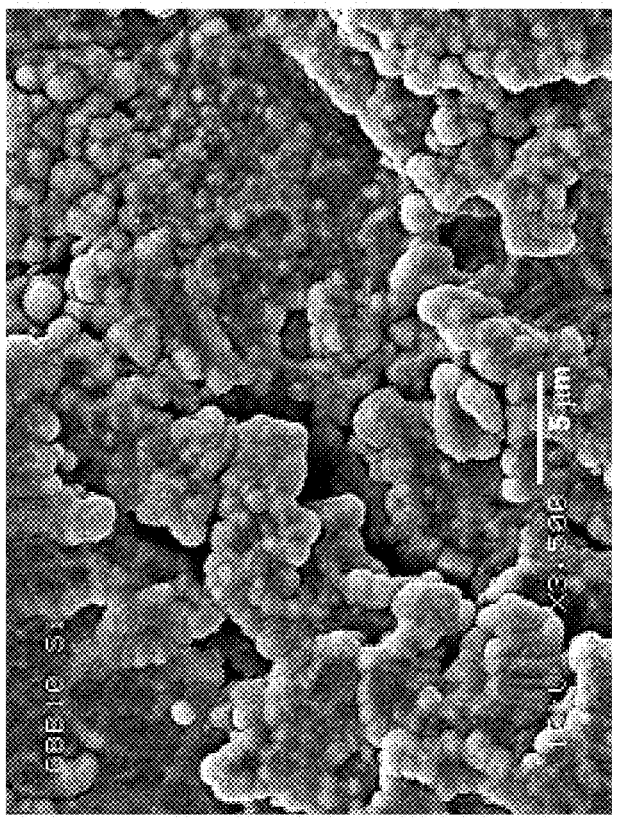
FIG. 14 is an SEM of a Ti sheet that was grit blasted followed by coating with a doped silicon layer.
Figure 13:
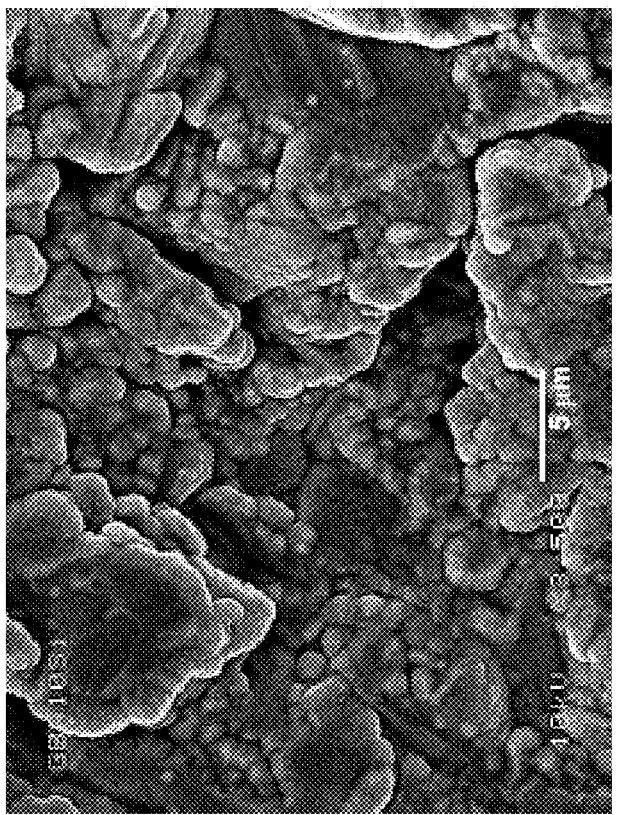
FIG. 13 is an SEM of a 0.032" thick Ti sheet that was grit blasted.

In another variation, a random pattern with both micron and nanometer-sized features can be generated on a surface by chemical and/or electrochemically etching and/or grit blasting. Examples of chemical etchants for titanium are ammonium bifluoride, sulfuric acid with or without an oxidizer (e.g., hydrogen peroxide) and other strong acids (e.g., trifluoromethanesulfonic acid, trifluoroacetic acid) and ammonium hydroxide and combinations thereof. The article Fiorenzo Vetrone et. al. "*Nanoscale Oxidative Patterning of Metallic Surfaces to Modulate Cell Activity and Fate*", Nano Letters Vol. 09, No. 2, 2009, pp. 659-665 provides examples of suitable etchants; the entire disclosure of this article is hereby incorporated by reference. FIG. 11 provides a high resolution scanning electron microscope (SEM) image of a Ti substrate that was etched in a 50% solution of $H_2SO_4$ for four hours at room temperature under agitation. This etching produces a random pattern of both micron-sized features and nanometer-sized feature from etching within the facets. Subsequently, the surface was coated with Ti; then, TiN; then, doped-Si using magnetron sputtering. FIG. 12 shows the etched part from FIG. 11 after this coating process. This same sample was placed in a sealed quartz tube furnace which was flushed for 20 minutes with Ar gas at 3 l/min and continually flushed while ramping the temperature from room temperature to 800° C. over 30 minutes followed by cooling over 4 hrs to room temperature. It is observed that the Si coating includes discrete islands that survive the heating process. Moreover, grit blasting can be incorporated into the texturing process. FIG. 13 is an SEM of a 0.032" thick Ti sheet that was grit blasted at 80 psi with size 50 SiC grit prior to etching and then coated with Ti, TiN and Si using physical vapor deposition. FIG. 14 is an SEM of a Ti sheet that was grit blasted following etching then cleaned with an aqueous automated cleaning line with ultrasonic agitation prior to coating with Ti, TiN and Si using physical vapor deposition.

To determine if a Ti-coated substrate with a doped-Si coating can survive the high temperature cycling of the CVD BDD process, samples were exposed to a heating cycle in an argon atmosphere in a quartz tube furnace from MTI Corporation (model number GSL-1100X). In these experiments, samples were placed in the quartz tube which was sealed and then flushed for 20 minutes with Ar gas at 3 l/min while maintaining a slight overpressure of 0.08 MPa. Flushing and overpressure continued while ramping the temperature from room temperature to 800° C. over a 30 minute period followed by a slow cooling over 4 hrs to room temperature. Subsequently, SCOTCH® tape was pressed on the coating and then pulled off to test the adhesion of the doped-Si coating. The Table below shows the results of coating adhesion after the heating cycle as related to the texturing operation. The Si coating deposited on the etched-only surface fully survived the heating process.

| Texturing operation | % of coating that survived after tape application/removal from the surface |
| --- | --- |
| No surface treatment | 2% |
| Grit blasting prior to etching in sulfuric acid | 90% |
| Grit blasting after etching in sulfuric acid | 90% |
| Etching in sulfuric acid | >99% |

As shown illustratively in FIG. 6, a predefined pattern of a doped silicon layer can also be produced by deposition of silicon by PVD techniques such as e-beam evaporation or magnetron sputtering through a mesh mask disposed above the metal substrate and spaced from the metal substrate at the distance from 10 μm to 3 mm. In this figure, the silicon sputtering flow 96 generated by the magnetron sputtering source 98 is deposited on the surface of the metal electrode substrate 94 through mask 92 made of mesh metal screen. In the mask-substrate assembly 35, the distance between the mask 92 and the substrate 94 is fixed by spacers (not shown). When the distance of the mask to the substrate surface is less than 10 μm, it can leave the exposed bare metal substrate unprotected with the barrier silicon coating, while a distance above 3 mm may not be sufficient to produce a modulated discrete surface profile of the silicon coated metal substrate. The optical photograph of the surface of metal plate with modulated TiN coating deposited through the mask is shown in FIG. 3. Alternatively, the substrate itself can be fabricated in the shape of a defined pattern; for example, a grid, screen or expanded metal piece.

Figure 15:
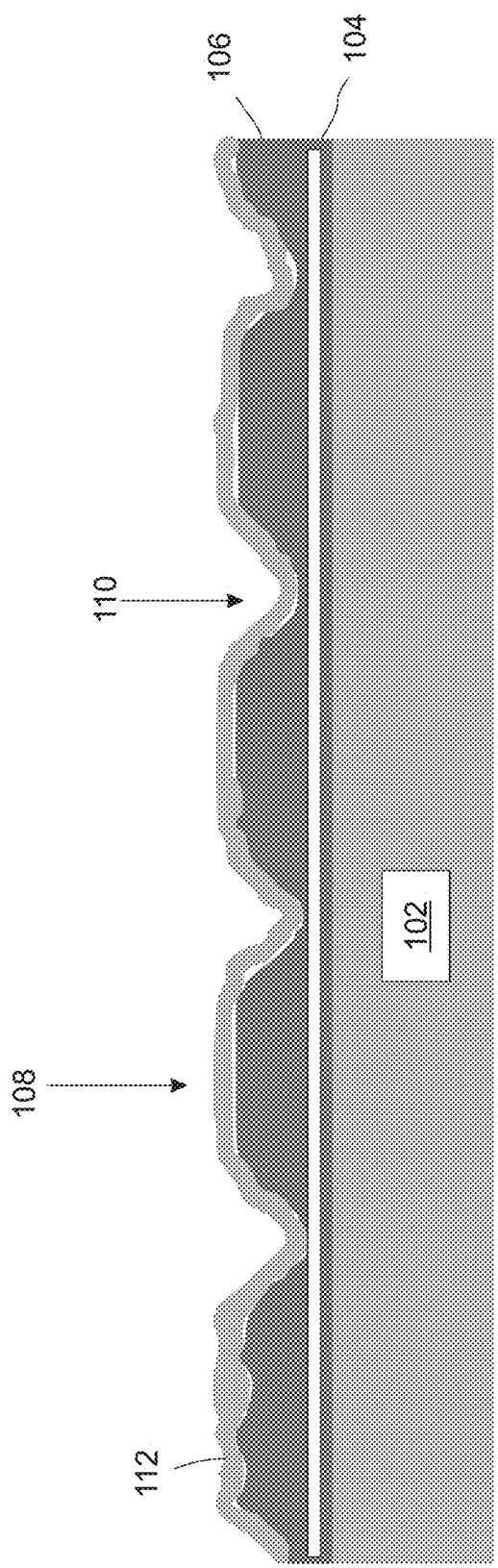
FIG. 15 is a schematic illustration of the coating architecture of an electrochemical electrode.

Doped silicon deposited over a modulated surface profile of a metal substrate includes elevated islands separated from each other by small gaps. Modulating the topography of the coating limits both stress in the coating and mismatch with the thermal expansion of the substrate. Depositing a silicon sublayer directly on a metal substrate is possible. Alternatively, the doped silicon sublayer, which is conductive, is deposited on top of a passive sublayer composed of semiconductor oxide, nitride or oxinitride. For example, titanium substrate can be coated initially with semiconducting titanium oxide and/or titanium nitride having a thickness ranging from 1 to 1000 nm followed by a boron-doped silicon coating having a thickness ranging from 1 to 10 μm. FIG. 15 illustrates the coating architecture of an electrochemical electrode. In this figure, the metal substrate 102 is coated by a semiconductive oxide, nitride or oxinitride coating sublayer 104. Subsequently, sublayer 104 is at least partially covered with the boron-doped silicon interlayer 106 with an orderly pattern of elevated islands 108 separated by the gaps 110, which is deposited through a mask by a DC magnetron sputtering process using a conductive boron-doped silicon target. Deposited on top of a silicon interlayer 106 is a catalyst layer 112 for the electrolytic generation of ozone.

Appropriate materials for catalyst layer 112 include conductive CVD diamond, amorphous carbon, graphite, lead dioxide, noble metals and noble metal oxides.

Figure 16:
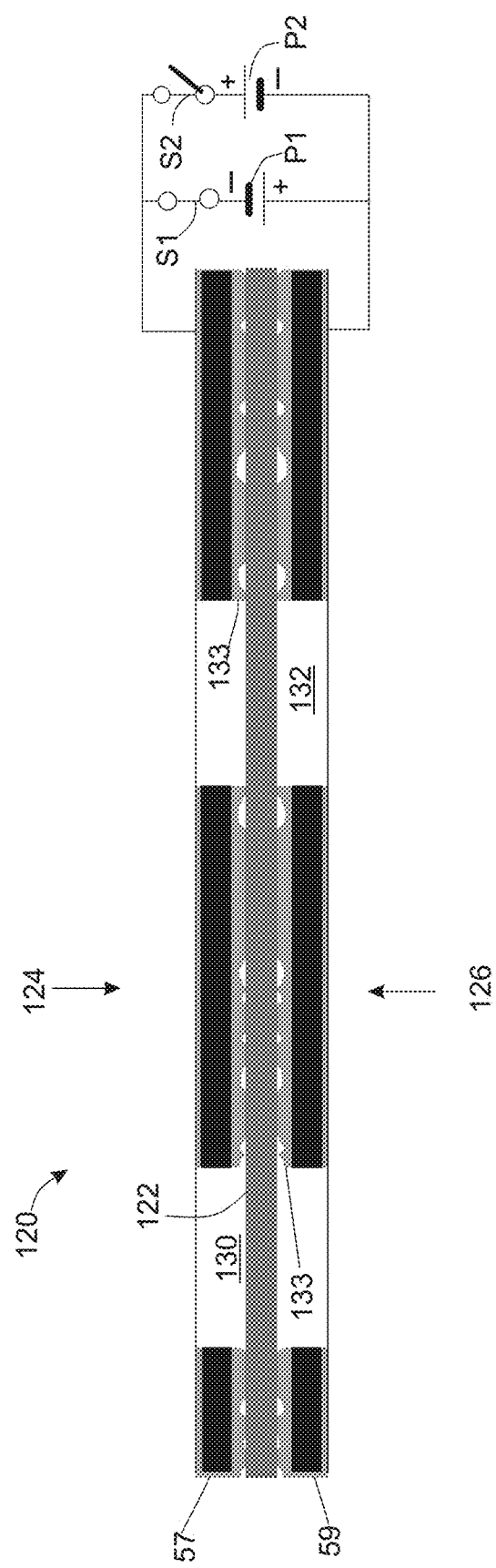
FIG. 16 provides a schematic illustration of an electrolytic cell for an ozone generator.

FIG. 16 provides a schematic illustration of an electrolytic cell for an ozone generator. Electrolytic cell 120 depicted in this figure incorporates the design of the electrochemical electrodes of FIG. 15. In FIG. 16, the NAFION® solid polymer membrane 122 separates the cathode 124 and the anode 126 of the electrolytic cell 120. Cathode 124 has holes 130 and anode 126 has holes 132 for removing the reactive species generated along membrane/electrode interface toward the surrounding water environment. The electrode's surface adjacent to the membrane is coated by rough boron-doped diamond coating 133 with a silicon interlayer. Microchannels can form between the electrode and membrane by intentional patterning of the surface of the diamond. The topography of the surface of the diamond includes the texture of the diamond coating and the topography of both the doped-Si interlayer and the substrate. In operation, microchannels will induce a microfluidic mass transfer along the electrode-membrane interface which includes transport of reactive species, ozone on anode side and hydrogen on cathode side toward the holes 130, 132 in the electrochemical electrodes and into the surrounding water environment. To avoid accumulation of mineral deposits on the cathode, the polarity of the two electrodes is swapped periodically using switches S1 and s2 and power supplies P1 and P2.

Example 1

Fabrication of BDD Coating for Ozone Generator

A titanium plate 3 cm×3 cm×0.1 cm with a 10×10 array of holes, each hole having a diameter of 0.5 mm with a spacing of 1.5 mm between, is used as a substrate. First, the substrate is etched. For this, 50% sulfuric acid is poured into a 500 ml beaker. A TEFLON®-coated stirring bar is dropped into the beaker. The beaker is stirred using a magnetic stirring device. The titanium plates are submerged into the sulfuric acid and held under for 4 hrs to create a textured surface with features on the scale of nanometers. The titanium is then removed and rinsed in de-ionized water. The substrates are then installed on a rotatable holder in a vacuum coating processing chamber with a DC magnetron sputtering source equipped with a boron-doped silicon target. After evacuation, the chamber is filled with argon to a pressure of 30 mT. Subsequently, a glow discharge is ignited on the substrate by applying 500 volts bias to the holder. The holder is rotated at 10 rpm. After 30 min of ion cleaning in glow discharge in argon, oxygen is introduced at a 30% partial pressure in relation to argon. Substrate treatment continues in the Ar/$O_2$ mixture for 1 hr to produce a titanium oxide interlayer. Optionally, a TiN sublayer can be deposited by magnetron sputtering and/or cathodic arc evaporation prior to silicon coating. The TiN sublayer serves as a barrier against silicon diffusion into bulk metal substrate. After this stage, the oxygen is evacuated and the DC magnetron sputtering of boron-doped silicon is started to produce a modulated boron-doped conductive silicon interlayer coating deposited on a titanium substrate. The silicon coating process lasts 2 hrs to produce a 1.5 um thick modulated boron-doped silicon interlayer. After this stage, the coating process is interrupted and the substrate is removed from the chamber. For the next stage, the substrate with the modulated conductive boron-doped silicon coating is subjected to diamond seeding by exposure in an ultrasonic bath with a nano-diamond suspension for 1 hr. After the seeding stage, the substrate is cleaned in acetone and dried in isopropyl alcohol before loading in a hot-filament CVD reactor for deposition of a boron-doped polycrystalline diamond coating that is 2-3 um thick. This process lasts for 5 hrs at a substrate temperature of 950° C. in a mixture of hydrogen/ 0.3% methane/0.001% triethylborane mixture at 100 torr. After this step, the substrate is removed from the chamber and assembled with a NAFION® SPM and a counter electrode made of tungsten to form an electrolytic cell for water treatment. The diamond coated electrode is connected to the positive pole of the power supply to serve as an anode and the counter electrode is connected to the negative pole to serve as a cathode in water treatment electrochemical process. The polarity of the electrodes is switched periodically to minimize build-up of mineral deposits on the cathode. The NAFION® can be either a solid piece or have holes aligned and perhaps concentric with the holes of the electrodes. If solid, the NAFION® would separate the water and reactive species in the cathodic and anodic regions. If perforated with holes, the anodic and cathodic regions would not be separated and water could flow through the cell.

Figure 17:
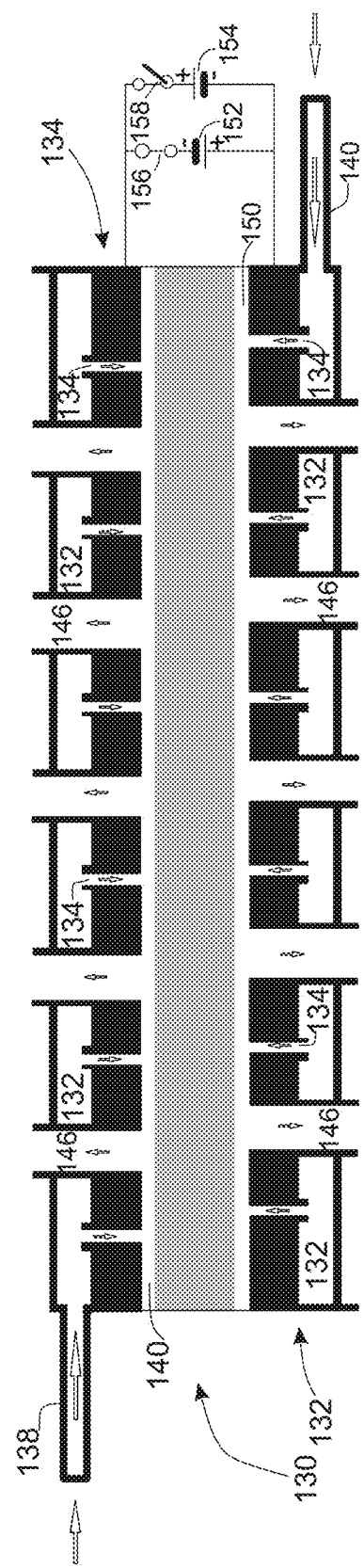
FIG. 17 is cross sectional schematic view of the electrolytic cell.
Figure 18:
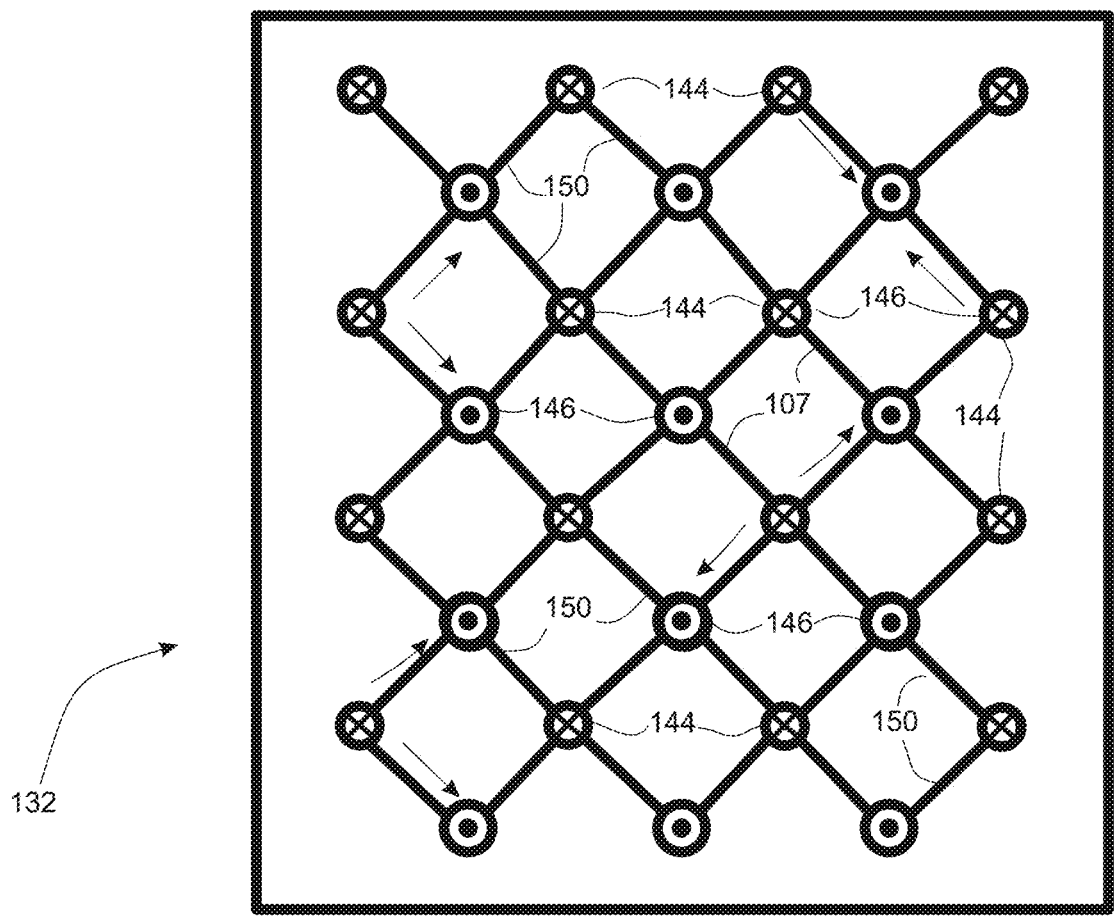
FIG. 18 is a schematic showing the water distribution on the anode side of the electrolytic cell of FIG. 17.

In a preferred embodiment of the invention, the water flow can be forced through the channels between the electrodes and the NAFION® SPE membrane. FIG. 17 is cross sectional schematic view of the electrolytic cell 130 with electrodes 132, 134 featuring forced flow of water. In this figure, the anode 132 and cathode 134 are separated by the NAFION® SPE membrane 136. The water is supplied through the pipes 138 and 140 in the water collectors positioned on a top of each electrode 132 and 134. The water distributing channels 140 are provided at the surface of the electrodes 132 and 134 facing the SPE membrane 136. The inlet holes 144 in the electrodes connect the water collector 142 to the channels 150. The outlet holes 146, generally having greater diameter than inlet holes 144, direct the water flow outside of the electrolytic cell 130. The direction of the water flow on each electrode side is shown by the arrows. The power supplies 152 and 154 and switches 156 and 158 allow switching the polarity of the voltage on the electrodes during operation. The sides of the electrodes facing the SPE membrane, including the channels are coated with catalytic coating consisting of boron-doped diamond, metal oxide, noble metal or noble metal oxides having high overpotential and good corrosion resistance both in anodic and cathodic electrolytic environments. The ozone and oxygen are produced along the channels 150 mostly at the 3-phase anode-to-SPE junction on anode side while the hydrogen is produced along the channels 150 mostly at the 3-phase cathode-to-SPE junction on cathode side. The water distribution on the anode side 132 of FIG. 17 is shown in FIG. 18. As depicted in FIG. 18, the water is supplied through water inlet holes 115 from the water collector (not shown) toward water channels 150 positioned at the side of the electrodes facing SPE membrane 136 (not shown). The water flows along the channels 150, where the ozone and oxygen are produced on anode side and hydrogen on cathode side, toward outlet holes 146. Water flows contain high concentrations of ozone and oxygen on the anode side, and hydrogen on the cathode side. Water leaves the electrolytic cell 130 through the outlet holes 146.

Figure 19:
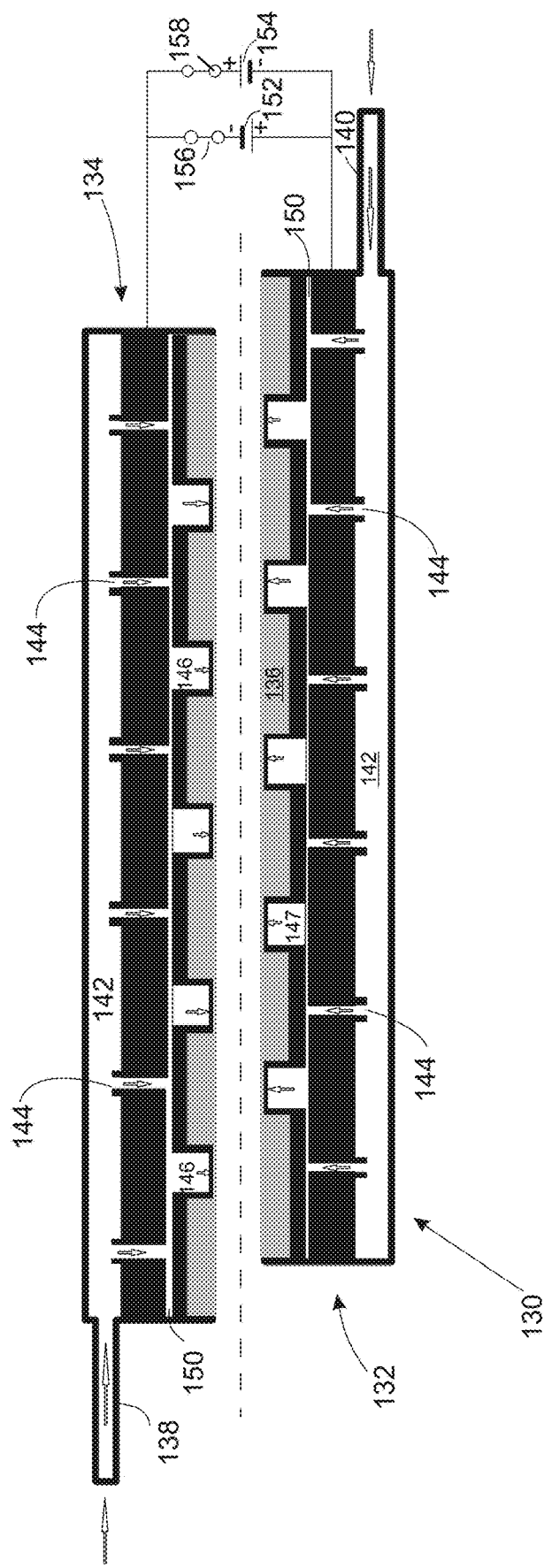
FIG. 19 is cross sectional schematic view of the electrolytic cell.
Figure 20:
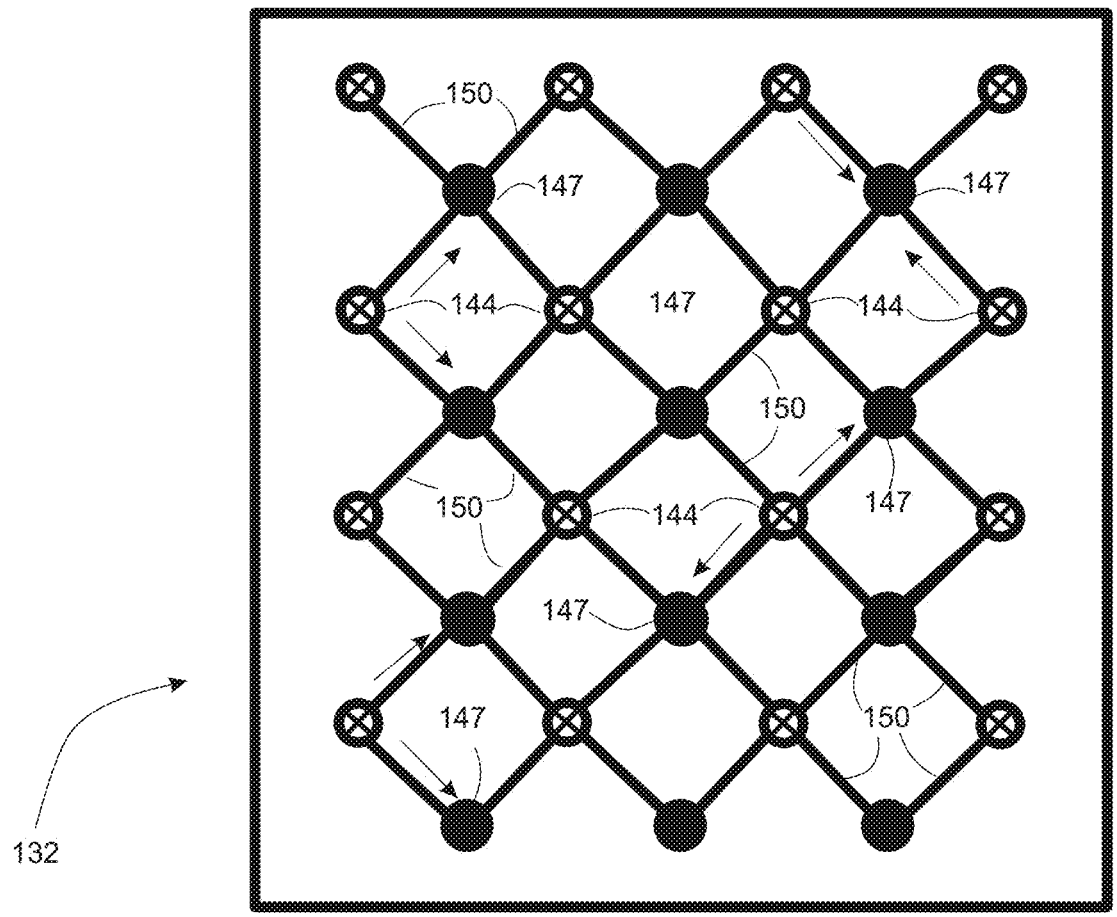
FIG. 20 is a schematic showing the water distribution on the anode side of the electrolytic cell of FIG. 19.

In a refinement of the forced flow design, the electrolytic cell design features flow through a perforated SPE membrane as shown schematically in a cross-sectional view in FIG. 19. In this embodiment of the invention, the water flow is supplied into collectors 142 through inlet tubes 138 and 140 into collectors on the side of anode 132 and cathode 134, respectively. From collectors 142, the water flow is directed through the inlet holes 144 toward channels 150, which connect the inlet holes 144 to the outlet holes 146 in SPE membrane 136 on the side of anode 132 and to the outlet holes 146 in SPE membrane 136 on the side of cathode 134. As shown in FIG. 17, the ozone and oxygen in this flow-through design are produced along the channels 150 on the side of electrodes facing the SPE membrane where the catalytic coating with high overpotential and high resistance against corrosion is provided on the anode side. Accordingly, hydrogen is produced along the channels 150 mostly at the 3-phase cathode-to-SPE junction on the cathode side. The ozonized water is directed outside of the electrolytic cell 10 through the cathodic side of the electrolytic cell 130 through outlet holes 146 in the SPE membrane 136, while hydrogen is directed in the opposite direction through the anodic side of the electrolytic cell 10 through outlet holes 146 in the SPE membrane 136. Water flows contain high concentrations of ozone and oxygen on the anode side, and hydrogen on the cathode side. Water leaves the electrolytic cell 130 through the outlet holes 146 and 147 in SPE membrane, respectively. The water distribution diagram on the anode 132 side of the flow-through water circulation electrolytic cell design of FIG. 19 is shown in FIG. 20. In this figure, the water is supplied through water inlet holes 134 from the water collector (not shown) towards water channels 150 positioned at the side of the electrodes facing SPE membrane 150 (not shown). The water flows along the channels 150, where the ozone and oxygen are produced on the anode side and hydrogen on the cathode side, toward outlet holes 147. Water flows contain high concentrations of ozone and oxygen on the anode side, and hydrogen on the cathode side. Water leaves the electrolytic cell 10 through the outlet holes 147 and 146, respectively.

Example 2

Fabrication of Metal Electrodes with Discreet ta-C:N Coating for Chlorine Generator A solid titanium plate 3 cm×12 cm×0.1 cm is used as a substrate. First, the substrate is cleaned in acetone and dried in isopropyl alcohol. After, a stainless steel mask screen with 0.15 mm opening and 0.05 mm diameter wire is attached to the front side of the substrate with a spacing of 0.1 mm from the substrate. The substrate-mask assembly is then installed on rotatable holder in a vacuum coating processing chamber with a DC magnetron sputtering source equipped with a boron-doped silicon target. After evacuation, the chamber is filled with argon to a pressure of 30 mT. Subsequently, a glow discharge is ignited on the substrate by applying 500 volts bias to the holder. The holder is rotated at 10 rpm. Substrate treatment continues in the Ar plasma for 1 hr to clean the surface of the titanium. After this stage, the DC magnetron sputtering of boron-doped silicon is started to produce a modulated boron-doped conductive silicon interlayer coating deposited on a titanium substrate through the mask. The silicon coating process lasts for 2 hrs to produce a 1.5 um thick modulated boron-doped silicon interlayer. After this stage, the argon flow is replaced by a flow of nitrogen gas and the background pressure is held at 0.05 mT to prepare for a deposition of nitrogen-doped tetrahedral amorphous carbon (ta-C:N). For this, a current of 140 amperes is ignited on a graphite plate. Carbon ions are evaporated from the graphite plate and steered using an electromagnetic field onto the substrates, which are held at a 50 V bias. The samples are rotated around the graphite plate and exposed intermittently to the carbon ions for a period of 4 hrs to build the thickness of ta-C:N to about 1.5 microns. After this stage, the substrate is removed from the chamber and assembled with a counter electrode made of tungsten to form an electrolytic cell for generation of chlorine in saltwater. The diamond coated electrode is connected to the positive pole of the power supply to serve as an anode, and the counter electrode is connected to the negative pole to serve as a cathode in saltwater treatment electrochemical process. The polarity of the electrodes is switched periodically to minimize build-up of mineral deposits on the cathode.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. An electrode for an ozone generator or chlorine generator, the electrode comprising:
   an electrically conductive substrate;
   a doped-silicon layer disposed over the electrically conductive substrate, the doped-silicon layer consisting of silicon and a dopant selected from the group consisting of boron and phosphorus, the doped-silicon layer defining a discrete architecture that maintains adhesion throughout a high temperature chemical vapor deposition boron-doped diamond process, the discrete architecture including an orderly pattern of elevated islands separated by gaps or an array of dimples; and
   a boron-doped diamond (BDD) layer disposed over the doped-silicon layer.

2. The electrode of claim 1 further comprising a barrier layer interposed between the doped-silicon layer and the electrically conductive substrate to limit diffusion of doped-Si into the electrically conductive substrate.

3. The electrode of claim 2 wherein the barrier layer is a semiconductor or metal nitride or oxide or nitro-oxide layer.

4. The electrode of claim 3 wherein the barrier layer is TiN or ZrN.

5. The electrode of claim 1 wherein the discrete architecture has a pattern with features less than 100 nm.

6. The electrode of claim 1 wherein the discrete architecture is formed using a mask.

7. The electrode of claim 1 wherein the electrically conductive substrate can also act as an electrical contact between a power source and the boron-doped diamond.

8. The electrode of claim 1 wherein the discrete architecture is a textured surface.

9. An electrode for an ozone generator or chlorine generator, the electrode comprising:
   an electrically conductive substrate;
   a silicon layer doped with boron or phosphorus disposed over the electrically conductive substrate, the silicon layer having formula Si, the silicon layer doped with boron or phosphorus defining a discrete architecture that maintains adhesion throughout a high temperature chemical vapor deposition boron-doped diamond process, the discrete architecture including an orderly pattern of elevated islands separated by gaps or an array of dimples; and a boron-doped diamond (BDD) layer disposed over the silicon layer doped with boron or phosphorus.

10. The electrode of claim 9 further comprising a barrier layer interposed between the silicon layer doped with boron or phosphorus and the electrically conductive substrate to limit diffusion of doped-Si into the electrically conductive substrate.

11. The electrode of claim 10 wherein the barrier layer is a semiconductor or metal nitride or oxide or nitro-oxide layer.

12. The electrode of claim 11 wherein the barrier layer is TiN or ZrN.

13. The electrode of claim 9 wherein the discrete architecture has a pattern with features less than 100 nm.

14. The electrode of claim 9 wherein the discrete architecture is formed using a mask.

15. The electrode of claim 9 wherein the electrically conductive substrate can also act as an electrical contact between a power source and the boron-doped diamond.

16. The electrode of claim 9 wherein the discrete architecture is a textured surface.

\* \* \* \* \*